(12) United States Patent
Horng et al.

(10) Patent No.: US 7,223,068 B2
(45) Date of Patent: *May 29, 2007

(54) HOUSING FOR AXIAL FLOW HEAT-DISSIPATING FAN

(75) Inventors: Alex Horng, Kaohsiung (TW);
Wen-Kuan Chen, Kaohsiung (TW);
Mei-Chih Fang, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 64 days.

This patent is subject to a terminal disclaimer.

(21) Appl. No.: 10/885,020

(22) Filed: Jul. 7, 2004

(65) Prior Publication Data

US 2005/0265828 A1    Dec. 1, 2005

(30) Foreign Application Priority Data

Jun. 1, 2004    (TW) ................................ 93115675 A

(51) Int. Cl.
*F04D 29/54* (2006.01)
(52) U.S. Cl. .................. 415/187; 415/186; 415/208.5; 415/211.1; 415/220; 415/119
(58) Field of Classification Search ........ 415/185–187, 415/208.2, 208.3, 208.4, 208.5, 211.1, 220, 415/223, 119, 175–178; 416/247 R
See application file for complete search history.

(56) References Cited

U.S. PATENT DOCUMENTS

| | | | |
|---|---|---|---|
| 6,132,171 A | | 10/2000 | Fujinaka et al. |
| 6,293,753 B1 | * | 9/2001 | Pal et al. ..................... 415/221 |
| 6,406,258 B1 | * | 6/2002 | Lin et al. ................. 415/208.5 |
| 6,710,486 B1 | | 3/2004 | Horng et al. |
| 2005/0281665 A1 | * | 12/2005 | Horng et al. .................. 415/60 |

* cited by examiner

*Primary Examiner*—Christopher Verdier
(74) *Attorney, Agent, or Firm*—Bacon & Thomas, PLLC

(57) ABSTRACT

A housing for an axial flow heat-dissipating fan includes an annular wall including an air inlet in a first end thereof and an air outlet in a second end thereof. A motor of an axial flow heat-dissipating fan is received in the annular wall. A plurality of axially extending slits are defined in a circumference of the annular wall. Each axially extending slit has a first end adjacent to the air outlet and a second end adjacent to the air inlet. A width of the first end of each axially extending slit is smaller than that of the second end of each axially extending slit.

20 Claims, 5 Drawing Sheets

HOUSING FOR AXIAL FLOW HEAT-DISSIPATING FAN

BACKGROUND OF THE INVENTION

1. Field of the Invention

The present invention relates to a housing for an axial flow heat-dissipating fan. In particular, the present invention relates to a housing for an axial flow heat-dissipating fan for increasing an inlet amount of air and for maintaining wind pressure inside the housing.

2. Description of Related Art

U.S. Pat. No. 6,132,171 discloses a blower that sucks air inside a wall through radial slits as a fan rotates. The wall is formed away from ends of fan blades. Outer peripheral sections of the wall are planar and substantially flush with a rectangular casing body at a middle of upper, lower, right, and left sides of the body. The radial slits are formed in the wall for increasing the air inlet amount. A plurality of annular plates are spaced from each other and stacked in a direction along an axis of rotation of the fan to form the wall with radial slits. Spacers forming and supporting the slits are arranged toward the middle of each of the four sides of the casing body and located on the outer peripheral sections. However, turbulence easily occurs when air is flowing through the area between the fan blades and the radial slits, as the airflow passing through the radial slits along a direction is almost orthogonal to the airflow passing through the air inlet.

U.S. Pat. No. 6,710,486 discloses a housing structure for a heat-dissipating fan. The housing structure comprises a housing, a plurality of axial guide blades, and a rotor. A radial air inlet is formed between two adjacent axial guide blades for increasing the inlet air amount. When the rotor is rotated, major airflow is sucked through an air inlet into the housing. Also, blades of the rotor change airflow sucked through the radial air inlets from a radial direction to the axial direction of the housing. Due to the additional airflow, airflow between the upstream and the downstream of the blades can be balanced and air noise is lowered. However, since each radial air inlet has a uniform width throughout its length, the airflow that has just left the air outlet may be sucked back into the housing at the area adjacent to the air outlet side when the airflow is being sucked by the rotor into the housing via the radial air inlets. The air output is thus adversely affected. Further, in a case that the radial air inlets are two wide, the air pressurizing effect in the housing is reduced, failing to provide expected blowing efficiency.

OBJECTS OF THE INVENTION

An object of the present invention is to provide a housing for an axial flow heat-dissipating fan with an increased air inlet amount.

Another object of the present invention is to provide a housing for an axial flow heat-dissipating fan with lowered blowing noise.

A further object of the present invention is to provide a housing for an axial flow heat-dissipating fan with increased air inlet efficiency and increased air outlet efficiency.

SUMMARY OF THE INVENTION

In accordance with an aspect of the present invention, a housing for an axial flow heat-dissipating fan comprises an annular wall including an air inlet in a first end thereof and an air outlet in a second end thereof. A motor of an axial flow heat-dissipating fan is received in the annular wall. A plurality of axially extending slits are defined in a circumference of the annular wall. At least one axially extending slit has a first end adjacent to the air outlet and a second end adjacent to the air inlet. A width of the first end of the axially extending slit is smaller than that of the second end of each axially extending slit.

The at least one axially extending slit is trapezoidal, conic, trumpet-like, etc. The annular wall may include at least one assembling section extending radially outward therefrom.

Preferably, a side delimiting each axially extending slit is inclined to smoothly guide ambient air surrounding the annular wall into the housing via the axially extending slit.

In an embodiment of the invention, the axially extending slits includes a first set of axially extending slits adjacent to the air inlet and a second set of axially extending slits adjacent to the air outlet. Each of the second set of axially extending slits has a width smaller than that of each of the first set of axially extending slits. The annular wall further includes a reinforcing rib located between the first set of axially extending slits and the second set of axially extending slits, with the reinforcing rib extending along the circumference of the annular wall to reinforce structure of the annular wall.

In another embodiment of the invention, the axially extending slits includes a first set of axially extending slits adjacent to the air inlet, a second set of axially extending slits adjacent to the air outlet, and a third set of axially extending slits between the first set of axially extending slits and the second set of axially extending slits. Each of the second set of axially extending slits has a width smaller than that of each of the third set of axially extending slits, which is smaller than that of each of the first set of axially extending slits.

The annular wall further includes a first reinforcing rib located between the first set of axially extending slits and the third set of axially extending slits, with the first reinforcing rib extending along the circumference of the annular wall to reinforce the structure of the annular wall. The annular wall further includes a second reinforcing rib located between the second set of axially extending slits and the third set of axially extending slits, with the second reinforcing rib extending along the circumference of the annular wall to reinforce structure of the annular wall.

In an embodiment of the invention, each of the first set of axially extending slits, an associated one of the second set of axially extending slits, and an associated one of the third set of axially extending slits are aligned with each other and together form a conic slit structure.

In another embodiment of the invention, each of the first set of axially extending slits, the second set of the axially extending slits, and the third set of axially extending slits is a parallelogram with a lengthwise side extending in a direction having an acute angle with an axial direction of the annular wall.

Other objects, advantages and novel features of this invention will become more apparent from the following detailed description when taken in conjunction with the accompanying drawings.

DETAILED DESCRIPTION OF THE PREFERRED EMBODIMENTS

Figure 1:
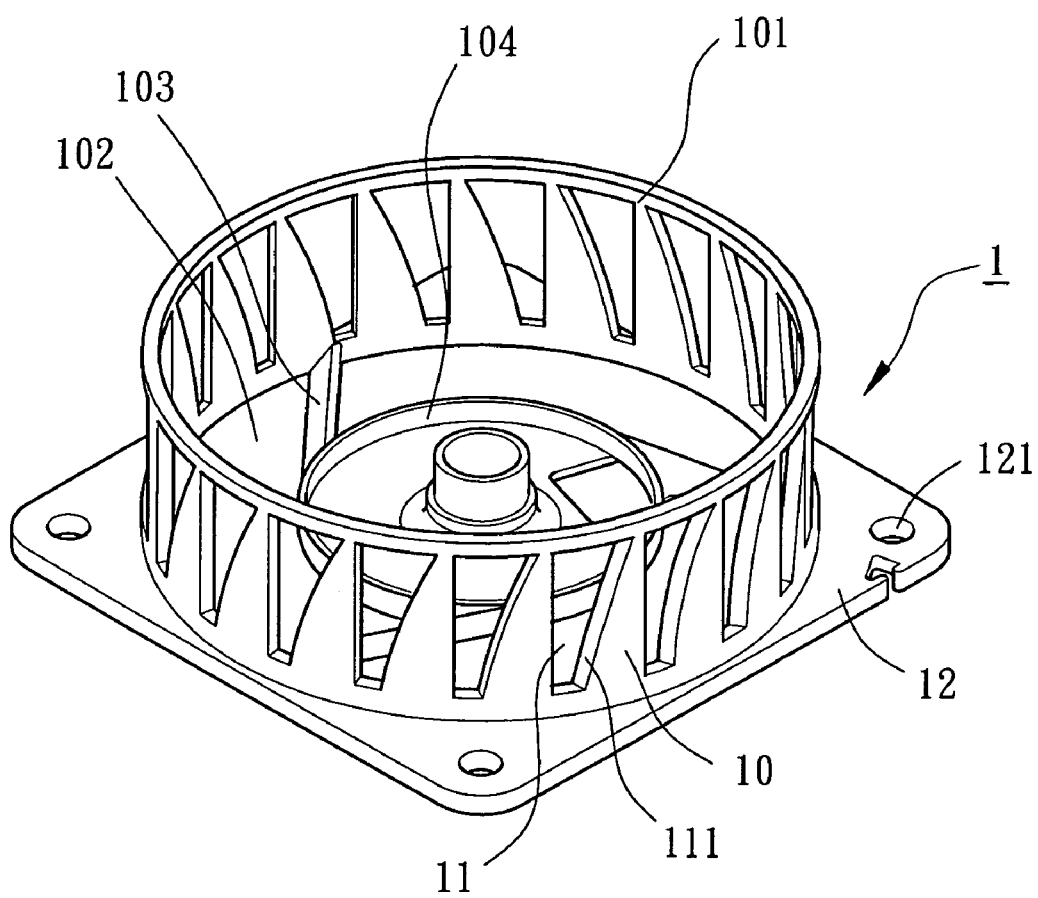
FIG. 1 is a perspective view of a first embodiment of a housing for an axial flow heat-dissipating fan in accordance with the present invention.
Figure 2:
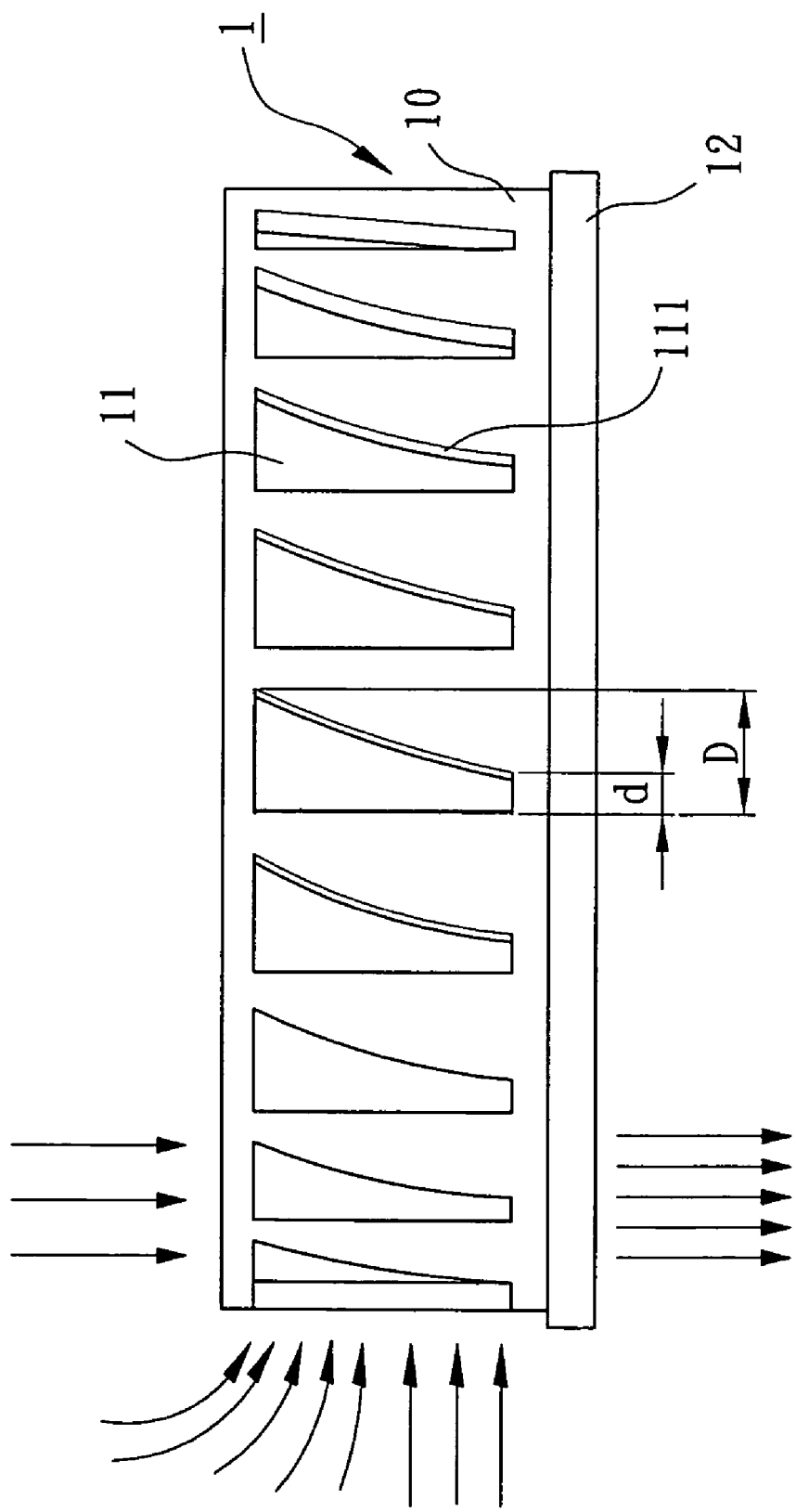
FIG. 2 is a side view of the housing in FIG. 1.

FIG. 1 is a perspective view of a first embodiment of a housing for an axial flow heat-dissipating fan in accordance with the present invention. FIG. 2 is a side view of the housing in FIG. 1.

The housing 1 for an axial flow heat-dissipating fan in accordance with the present invention comprises an annular wall 10 that is substantially circular when viewed in section. The annular wall 10 includes an air inlet 101 in an end thereof and an air outlet 102 in the other end thereof. A base 104 is mounted in the air outlet 102 and supported by a plurality of ribs 103 between the base 104 and the annular wall 10. A motor (not shown) of an axial flow heat-dissipating fan is mounted to the base 104.

The annular wall 10 further includes a plurality of axially extending slits 11 equispaced along a circumference of the annular wall 10 for drawing ambient air surrounding the annular wall 10. Preferably, a width of each axially extending slit 11 increases from a first end thereof adjacent to the air outlet 102 toward a second end thereof adjacent to the air inlet 101 (see "d" and "D" in FIG. 2). Thus, each axially extending slit 11 may be trapezoidal, conic, trumpet-like, etc. Further, a side 111 delimiting a portion of each axially extending slit 11 may be inclined to smoothly guide the ambient air into the housing 1 via the axially extending slit 11. The annular wall 10 may further include four assembling sections 12 extending radially outward therefrom, with each assembling section 12 has a hole 121 for mounting the housing 1 in place.

As illustrated in FIG. 2, air is drawn into the housing 1 via the air inlet 101 and the axially extending slits 11 when the motor of the heat-dissipating fan turns. The airflow from the air inlet 101 and the airflow from the axially extending slits 11 merge with each other and flow toward the air outlet 102. By such an arrangement, the overall air inlet amount is increased, generation of turbulent is avoided, and the wind noise of the incoming air is lowered. The axially extending slits 11 thus configured assure an increase of the air inlet amount via the axially extending slits 11 and assure obtaining of a sufficient air inlet amount via the axially extending slits 11. Further, since the width of each axially extending slit 11 increases from the first end thereof adjacent to the air outlet 102 toward the second end thereof adjacent to the air inlet 101, a sealing effect is provided for the annular wall 10, providing an improved air-pressuring effect and thus maintaining a higher wind pressure output. Further, the axially extending slits 11 thus configured avoid the airflow that has just left the air outlet 102 from being sucked back into the housing 1 via the axially extending slits 11. The overall air inlet efficiency and the overall air outlet efficiency are assured, generation of turbulent is avoided, and the air intake/output noise is lowered.

Figure 3:
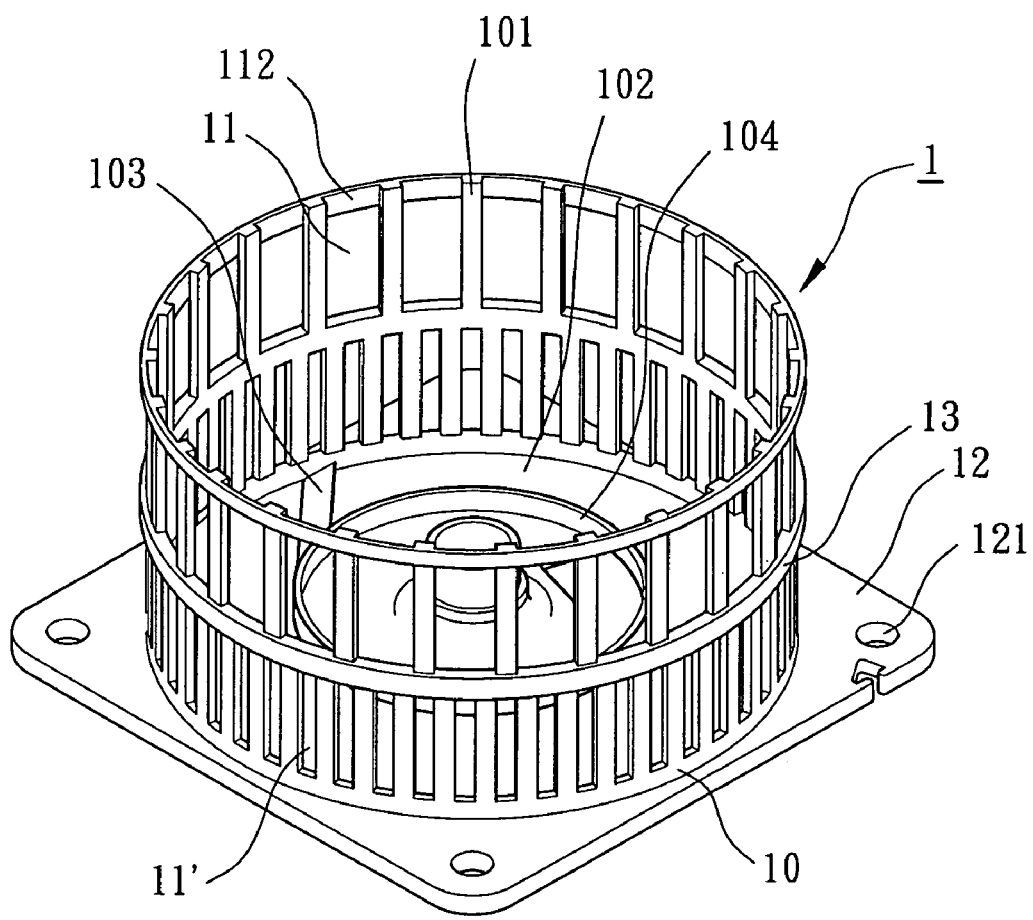
FIG. 3 is a perspective of a second embodiment of the housing in accordance with the present invention.
Figure 4:
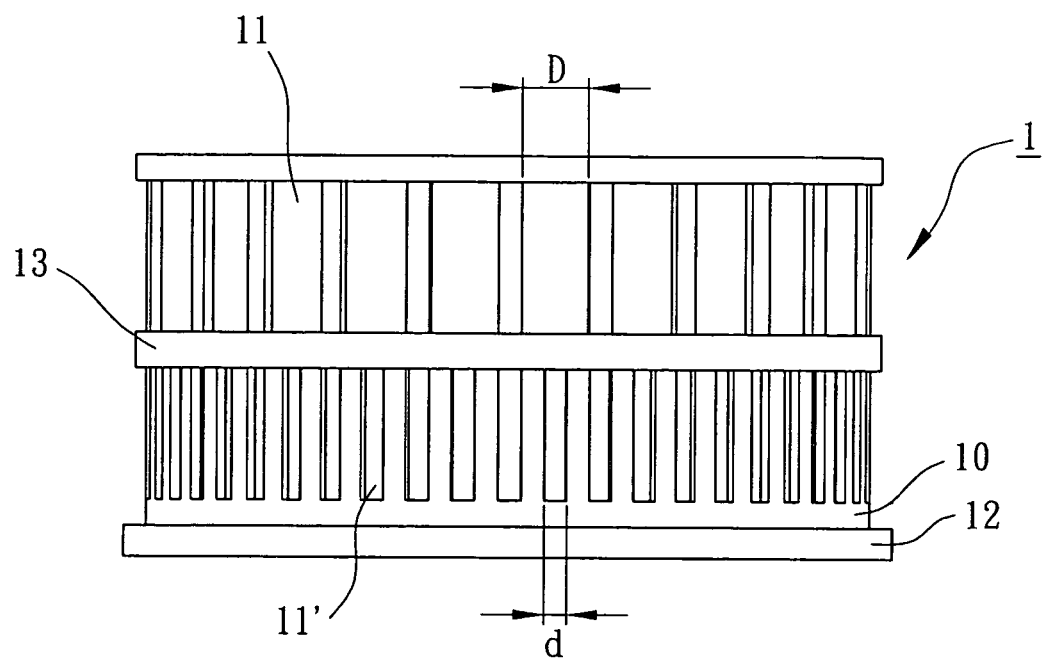
FIG. 4 is a side view of the housing in FIG. 3.

FIGS. 3 and 4 illustrate a second embodiment of the housing 1 in accordance with the present invention. In this embodiment, the annular wall 10 of the housing 1 includes a first set of axially extending slits 11 adjacent to the air inlet 101 of the housing 1 and a second set of axially extending slits 11' adjacent to the air outlet 102 of the housing 1. At least one of the first set of axially extending slit 11 includes an end 12 extending through an end face of the annular wall 10 and communicated with the air inlet 101. Each of the second set of axially extending slits 11' has a width d smaller than that D of each of the first set of axially extending slits 11. Further, a reinforcing rib 13 is located between the first set of axially extending slits 11 and the second set of axially extending slits 11' and extends along the circumference of the annular wall 10. The reinforcing rib 13 reinforces the structure of the annular wall 10 with axially extending slits 11 and 11'. The overall air inlet amount is increased, the airflow entering the housing 1 via the axially extending slits 11 and 11' is separate from the airflow exiting the air outlet 102, and the air-pressurizing effect is improved. Further, intake of the airflows via the axially extending slits 11 and 11' and the air inlet 101 is smoother while lowering the air noise (or blowing noise) during intake of the air.

Figure 5:
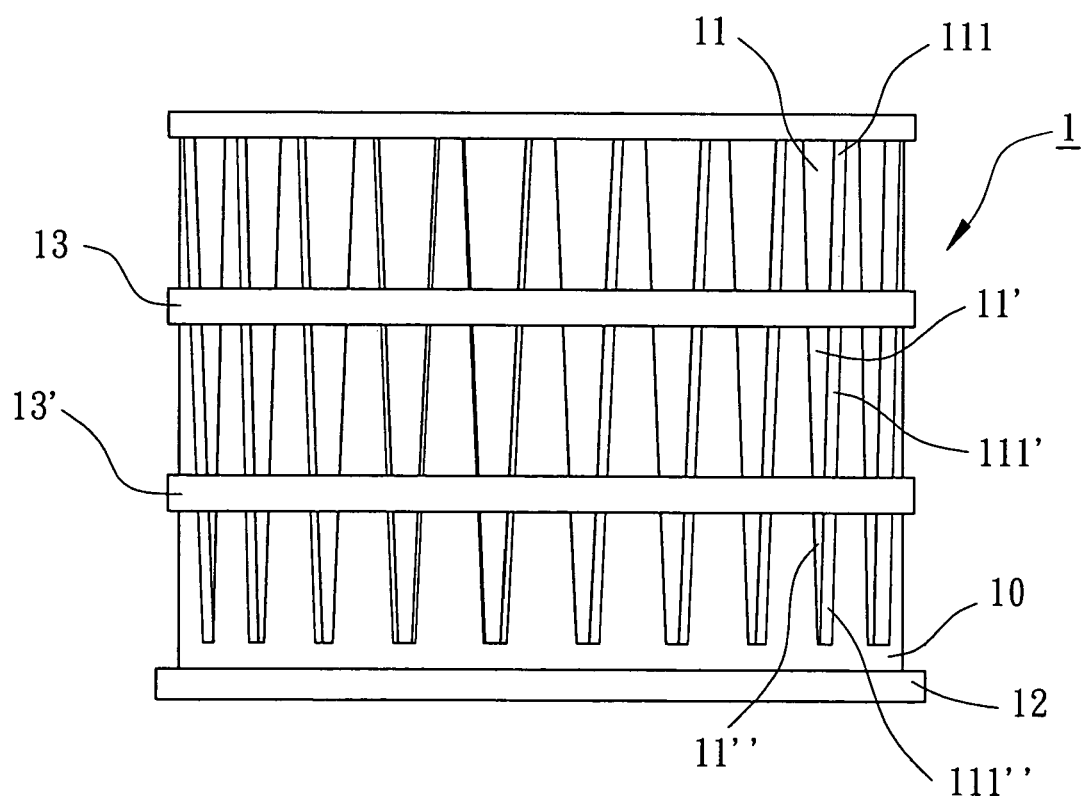
FIG. 5 is a side view of a third embodiment of the housing in accordance with the present invention.

FIG. 5 illustrates a third embodiment of the housing 1 in accordance with the present invention. In this embodiment, the annular wall 10 of the housing 1 includes a first set of axially extending slits 11 adjacent to the air inlet 101 of the housing 1, a second set of axially extending slits 11" adjacent to the air outlet 102 of the housing 1, and a third set of axially extending slits 11' between the first set of axially extending slits 11 and the second set of axially extending slits 11". Each of the second set of axially extending slits 11" has a width smaller than that of each of the third set of axially extending slits 11', which, in turn, smaller than that of each of the first set of axially extending slits 11. Further, a reinforcing rib 13 is located between the first set of axially extending slits 11 and the third set of axially extending slits 11' and extends along the circumference of the annular wall 10. Similarly, a reinforcing rib 13' is located between the third set of axially extending slits 11' and the second set of axially extending slits 11' and extends along the circumference of the annular wall 10. The reinforcing ribs 13 and 13' reinforce the structure of the annular wall 10 with axially extending slits 11, 11' and 11". The overall air inlet amount is increased, the airflow entering the housing 1 via the axially extending slits 11, 11', and 11" is separate from the airflow exiting the air outlet 102, and the air-pressurizing effect is improved. Further, entrance of the airflows via the axially extending slits 11 and 11' and the air inlet 101 is smoother while lowering the air noise during intake of the air.

Preferably, each of the first set of axially extending slits 11, an associated one of the third set of axially extending slits 11', an associated one of the second set of the axially extending slits 11" are aligned with each other and together form a conic slit structure shown in FIG. 5. Further, a side 111, 111', 111" delimiting a portion of each axially extending slit 11, 111', 11" may be inclined to smoothly guide the ambient air into the housing 1 via the axially extending slit 11, 11', 11".

Figure 6:
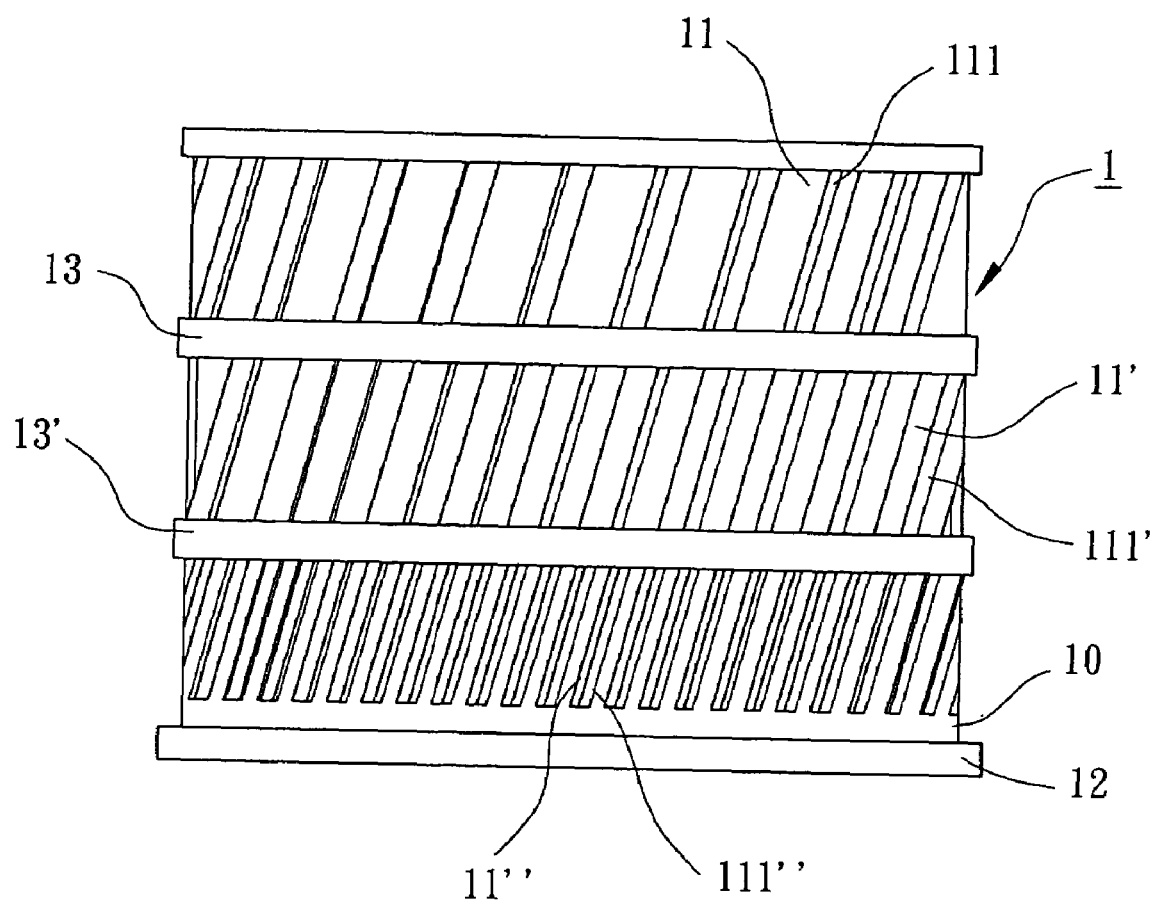
FIG. 6 is a side view of a fourth embodiment of the housing in accordance with the present invention

FIG. 6 illustrates a fourth embodiment of the housing 1 in accordance with the present invention modified from the third embodiment. In this embodiment, the annular wall 10 of the housing 1 includes a first set of axially extending slits 11 adjacent to the air inlet 101 of the housing 1, a second set of axially extending slits 11" adjacent to the air outlet 102 of the housing 1, and a third set of axially extending slits 11' between the first set of axially extending slits 11 and the second set of axially extending slits 11". Each of the second set of axially extending slits 11" has a width smaller than that of each of the third set of axially extending slits 11', which, in turn, smaller than that of each of the first set of axially extending slits 11. Further, each axially extending slit 11, 11', 11" is a parallelogram with a lengthwise side extending along a direction having an acute angle with an axial direction of the annular wall 10, thereby smoothly guiding the ambient air into the housing 1 via the axially extending slits 11, 11' and 11". The overall air inlet amount is increased, the airflow entering the housing 1 via the axially extending slits 11, 11', and 11" is separate from the airflow exiting the air outlet 102, and the air-pressurizing effect is improved. Further, entrance of the airflows via the axially extending slits 11, 11', and 11" and the air inlet 101 is smoother while lowering the air noise during intake of the air. Further, a side 111, 111', 111" delimiting a portion of each axially extending slit 11, 111', 111" may be inclined to smoothly guide the ambient air into the housing 1 via the axially extending slit 11, 11', 11".

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A housing for an axial flow heat-dissipating fan, comprising:
    an annular wall including an air inlet in a first end of the annular wall and an air outlet in a second end of the annular wall; and
    a plurality of axially extending slits defined in a circumference of the annular wall, at least one of said axially extending slits having a first end adjacent to the air inlet and a second end adjacent to the air outlet, a width of the second end of said at least one axially extending slit being smaller than that of the first end of said at least one axially extending slit in a longitudinal direction of the housing.

2. The housing for an axial flow heat-dissipating fan as claimed in claim 1, wherein said at least one axially extending slit is one of trapezoidal, conic, and trumpet-like.

3. The housing for an axial flow heat-dissipating fan as claimed in claim 1, wherein a side delimiting said at least one axially extending slit is inclined to smoothly guide ambient air surrounding the annular wall into the housing via said at least one extending slit.

4. The housing for an axial flow heat-dissipating fan as claimed in claim 1, wherein the annular wall includes at least one assembling section extending radially outward from the annular wall.

5. A housing for an axial flow heat-dissipating fan, comprising:
    an annular wall including an air inlet in a first end of the annular wall and an air outlet in a second end of the annular wall; and
    a plurality of axially extending slits defined in a circumference of the annular wall,
    wherein said axially extending slits include a first set of axially extending slits adjacent to the air inlet and a second set of axially extending slits adjacent to the air outlet, each of the second set of axially extending slits has a width smaller than that of each of the first set of axially extending slits.

6. The housing for an axial flow heat-dissipating fan as claimed in claim 5, wherein the annular wall further includes a reinforcing rib located between the first set of axially extending slits and the second set of axially extending slits, with the reinforcing rib extending along the circumference of the annular wall to reinforce the structure of the annular wall.

7. The housing for an axial flow heat-dissipating fan as claimed in claim 5, wherein at least one of the axially extending slits includes an end extending through an end face of the first end of the annular wall and communicating with the air inlet.

8. The housing for an axial flow heat-dissipating fan as claimed in claim 5, wherein a side delimiting each of the first set of axially extending slits is inclined to smoothly guide ambient air surrounding the annular wall into the housing via the first set of axially extending slits.

9. The housing for an axial flow heat-dissipating fan as claimed in claim 8, wherein a side delimiting each of the second set of axially extending slits is inclined to smoothly guide ambient air surrounding the annular wall into the housing via the second set of axially extending slits.

10. The housing for an axial flow heat-dissipating fan as claimed in claim 5, wherein a side delimiting each of the second set of axially extending slits is inclined to smoothly guide ambient air surrounding the annular wall into the housing via the second set of axially extending slits.

11. A housing for an axial flow heat-dissipating fan, comprising:
    an annular wall including an air inlet in a first end of the annular wall and an air outlet in a second end of the annular wall; and
    a plurality of axially extending slits defined in a circumference of the annular wall, wherein said axially extending slits include a first set of axially extending slits adjacent to the air inlet, a second set of axially extending slits adjacent to the air outlet, and a third set of axially extending slits between the first set of axially extending slits and the second set of axially extending slits, each of the second set of axially extending slits has a width smaller than that of each of the third set of axially extending slits, which is smaller than that of each of the first set of axially extending slits.

12. The housing for an axial flow heat-dissipating fan as claimed in claim 11, wherein the annular wall further includes a first reinforcing rib located between the first set of axially extending slits and the third set of axially extending slits, with the first reinforcing rib extending along the circumference of the annular wall to reinforce the structure of the annular wall, the annular wall further including a second reinforcing rib located between the second set of axially extending slits and the third set of axially extending slits, with the second reinforcing rib extending along the circumference of the annular wall to reinforce the structure of the annular wall.

13. The housing for an axial flow heat-dissipating fan as claimed in claim 11, wherein a side delimiting each of the first set of axially extending slits is inclined to smoothly guide ambient air surrounding the annular wall into the housing via the first set of axially extending slits.

14. The housing for an axial flow heat-dissipating fan as claimed in claim 13, wherein a side delimiting each of the second set of axially extending slits is inclined to smoothly guide ambient air surrounding the annular wall into the housing via the second set of axially extending slits.

15. The housing for an axial flow heat-dissipating fan as claimed in claim 14, wherein a side delimiting each of the third set of axially extending slits is inclined to smoothly guide ambient air surrounding the annular wall into the housing via the third set of axially extending slits.

16. The housing for an axial flow heat-dissipating fan as claimed in claim 13, wherein a side delimiting each of the third set of axially extending slits is inclined to smoothly guide ambient air surrounding the annular wall into the housing via the third set of axially extending slits.

17. The housing for an axial flow heat-dissipating fan as claimed in claim 11, wherein a side delimiting each of the second set of axially extending slits is inclined to smoothly guide ambient air surrounding the annular wall into the housing via the second set of axially extending slits.

18. The housing for an axial flow heat-dissipating fan as claimed in claim 11, wherein a side delimiting each of the third set of axially extending slits is inclined to smoothly guide ambient air surrounding the annular wall into the housing via the third set of axially extending slits.

19. The housing for an axial flow heat-dissipating fan as claimed in claim 11, wherein each of the first set of axially extending slits, an associated one of the second set of axially extending slits, and an associated one of the third set of axially extending slits are aligned with each other and together form a conic slit structure.

20. The housing for an axial flow heat-dissipating fan as claimed in claim 11, wherein each of the first set of axially extending slits, the second set of the axially extending slits, and the third set of axially extending slits is a parallelogram with a lengthwise side extending in a direction having an acute angle with an axial direction of the annular wall.

* * * * *